US 6,560,288 B1

(12) United States Patent
Gilbert et al.

(10) Patent No.: US 6,560,288 B1
(45) Date of Patent: May 6, 2003

(54) METHOD AND SYSTEM FOR VARIABLE LENGTH DECODING

(75) Inventors: Marcus Alan Gilbert, Plano, TX (US); Joseph R. Zbiciak, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/464,732

(22) Filed: Dec. 15, 1999

Related U.S. Application Data

(60) Provisional application No. 60/115,563, filed on Jan. 12, 1999.

(51) Int. Cl.[7] .......................... H04N 7/12; H04N 11/04; H04N 11/02
(52) U.S. Cl. ................................... 375/240.23; 341/65
(58) Field of Search ...................... 375/240.23; 382/246, 382/244; 358/247; 341/65

(56) References Cited

U.S. PATENT DOCUMENTS 6,219,457 B1 * 4/2001 Potu ........................... 382/246
6,246,347 B1 * 6/2001 Bakhmutsky ................. 341/67
6,298,087 B1 * 10/2001 Luna ...................... 375/240.25
6,324,306 B1 * 11/2001 Natsume .................... 382/246
6,385,341 B1 * 5/2002 Lisitsa ....................... 382/233

OTHER PUBLICATIONS

*MPEG Document,* ISO/IEC 13818–2:1995(E), 1995, 219 pages.

Eckart, Stefan; /* getblk.c, DCT block decoding (mpeg2decode), 13 pages, Jul. 13, 1994.

/* getvic.h, variable length code tables, MPEG Software Simulation Group, 9 pages, 1994.

* cited by examiner

*Primary Examiner*—Chris Kelley
*Assistant Examiner*—Charles Parsons
(74) *Attorney, Agent, or Firm*—Robert D. Marshall, Jr.; W. James Brady, III; Frederick J. Telecky, Jr.

(57) ABSTRACT

Variable length codes in a compressed data stream are identified by determining a leading position of a specified value in the compressed data stream. A length of a leading code in the compressed data stream is then determined based on the leading position of the specified value.

6 Claims, 3 Drawing Sheets

| LENGTH | SIGNIFICANT DIGIT SET | RUN | LEVEL | SIGN |
|---|---|---|---|---|
| 6 | 00000 | ERROR | ERROR | ERROR |
| 6 | 00001 | ERROR | ERROR | ERROR |
| 6 | 00010 | ERROR | ERROR | ERROR |
| 6 | 00011 | ERROR | ERROR | ERROR |
| 6 | 00100 | ERROR | ERROR | ERROR |
| 6 | 00101 | ERROR | ERROR | ERROR |
| 6 | 00110 | ERROR | ERROR | ERROR |
| 6 | 00111 | ERROR | ERROR | ERROR |
| 6 | 01000 | 0 | 3 | POSITIVE |
| 6 | 01001 | 0 | 3 | POSITIVE |
| 6 | 01010 | 0 | 3 | POSITIVE |
| 6 | 01011 | 0 | 3 | POSITIVE |
| 6 | 01100 | 0 | 3 | NEGATIVE |
| 6 | 01101 | 0 | 3 | NEGATIVE |
| 6 | 01110 | 0 | 3 | NEGATIVE |
| 6 | 01111 | 0 | 3 | NEGATIVE |
| 6 | 10000 | 4 | 1 | POSITIVE |
| 6 | 10001 | 4 | 1 | POSITIVE |
| 6 | 10010 | 4 | 1 | POSITIVE |
| 6 | 10011 | 4 | 1 | POSITIVE |
| 6 | 10100 | 4 | 1 | NEGATIVE |
| 6 | 10101 | 4 | 1 | NEGATIVE |
| 6 | 10110 | 4 | 1 | NEGATIVE |
| 6 | 10111 | 4 | 1 | NEGATIVE |
| 6 | 11000 | 3 | 1 | POSITIVE |
| 6 | 11001 | 3 | 1 | POSITIVE |
| 6 | 11010 | 3 | 1 | POSITIVE |
| 6 | 11011 | 3 | 1 | POSITIVE |
| 6 | 11100 | 3 | 1 | NEGATIVE |
| 6 | 11101 | 3 | 1 | NEGATIVE |
| 6 | 11110 | 3 | 1 | NEGATIVE |
| 6 | 11111 | 3 | 1 | NEGATIVE |

*FIG. 2*

METHOD AND SYSTEM FOR VARIABLE LENGTH DECODING

This application claims priority under 35 USC §119(e)(1) of Provisional Application No. 60/115,563, filed Jan. 12, 1999.

TECHNICAL FIELD OF THE INVENTION

This invention relates generally to the field of data compression, and more particularly to a method and system for variable length decoding.

BACKGROUND OF THE INVENTION

To reduce bandwidth required to transmit a video stream or memory space required to store a video file, motion video is compressed for transmission and storage. MPEG coding was developed in response to a need for a generic coding method for motion video and associated audio for various applications such as digital storage media, television broadcasting, and communication. The use of MPEG allows motion video to be manipulated as a form of computer data and to be stored on various storage media, transmitted and received over existing networks, and distributed on existing broadcasting channels.

MPEG and other encoding methods compress motion video by transforming video data into a series of variable length codes. Often used types of video data are represented by shorter codes while less frequently used types of video data are represented by longer codes. In this way, compression is further increased.

Traditional solutions for decoding MPEG and other variable length codes use redundantly-coded tables in order to determine the value and the length of the codes. Using this methodology, decoding of a next code in the compressed stream cannot begin until the current code is fully decoded. This is because the length of the current code is not known, and thus the beginning of the next code is not determinable. As architectures increase in speed, the latency of memory access relative to the speed of computation increases. As a result, variable length decoding has become bottlenecked in the table lookup stage. In addition, depending on the specific variable length code being decoded, three or four table-lookups in a hierarchical arrangement of tables may be needed to finally decode a given symbol.

Traditionally, hardware solutions have been used to reduce bottlenecks in the table-lookup stage. Such hardware solutions, however, are expensive to implement and add design complexity to the system. Further, hardware solutions are not amicable to emerging variable length decoding standards, such as the 3-D scheme contained in MPEG-4. Thus, many existing hardware implementations are locked into supporting a small set of existing standards.

SUMMARY OF THE INVENTION

The present invention provides a method and system for variable length decoding that substantially eliminate or reduce disadvantages and problems associated with previously developed systems and methods. In particular, the present invention determines the length of variable length codes in a compressed data stream using information in the compressed data stream.

In accordance with one embodiment of the present invention, variable length codes are identified in a compressed data stream by determining a leading position of a specified value in the compressed data stream. A length of a leading code in the compressed data stream is determined based on the leading position of the specified value.

More particularly, in accordance with a particular embodiment of the present invention, a table of decode entries is provided that is organized and accessed by code length. In this embodiment, the leading code is decoded by matching at least part of the leading code to a decode entry in the table for the length of the leading code. In addition, the leading code may be extracted from the compressed data stream prior to decoding to allow processing of a next leading code while decoding the leading code.

Technical advantages of the present invention include providing an improved method and system for variable length decoding. In particular, code lengths in a compressed data stream are determined based on information in the compressed data stream. As a result, code length may be determined prior to decoding, and processing of a next code begun while decoding the previous code. Thus, adjacent codes are processed in parallel rather than serially, which reduce bottlenecks at the decode stage.

Another technical advantage of the present invention includes providing reduced decode table size for variable length decoding. In particular, because code length is determined based on information in a compressed data stream, length storage is no longer necessary in decode tables and multiple lookups per code are eliminated. In addition, processor utilization is increased because code length is available sooner and the decode rate is constant.

Other technical advantages of the present invention will be readily apparent to one skilled in the art from the following figures, description, and claims.

BRIEF DESCRIPTION OF THE DRAWINGS

For a more complete understanding of the present invention and its advantages, reference is now made to the following description taken in conjunction with the accompanying drawings, wherein like reference numerals represent like parts, in which:

FIG. 2 illustrates details of the decode table of FIG. 1 in accordance with one embodiment of the present invention.

DETAILED DESCRIPTION OF THE INVENTION

Figure 1:
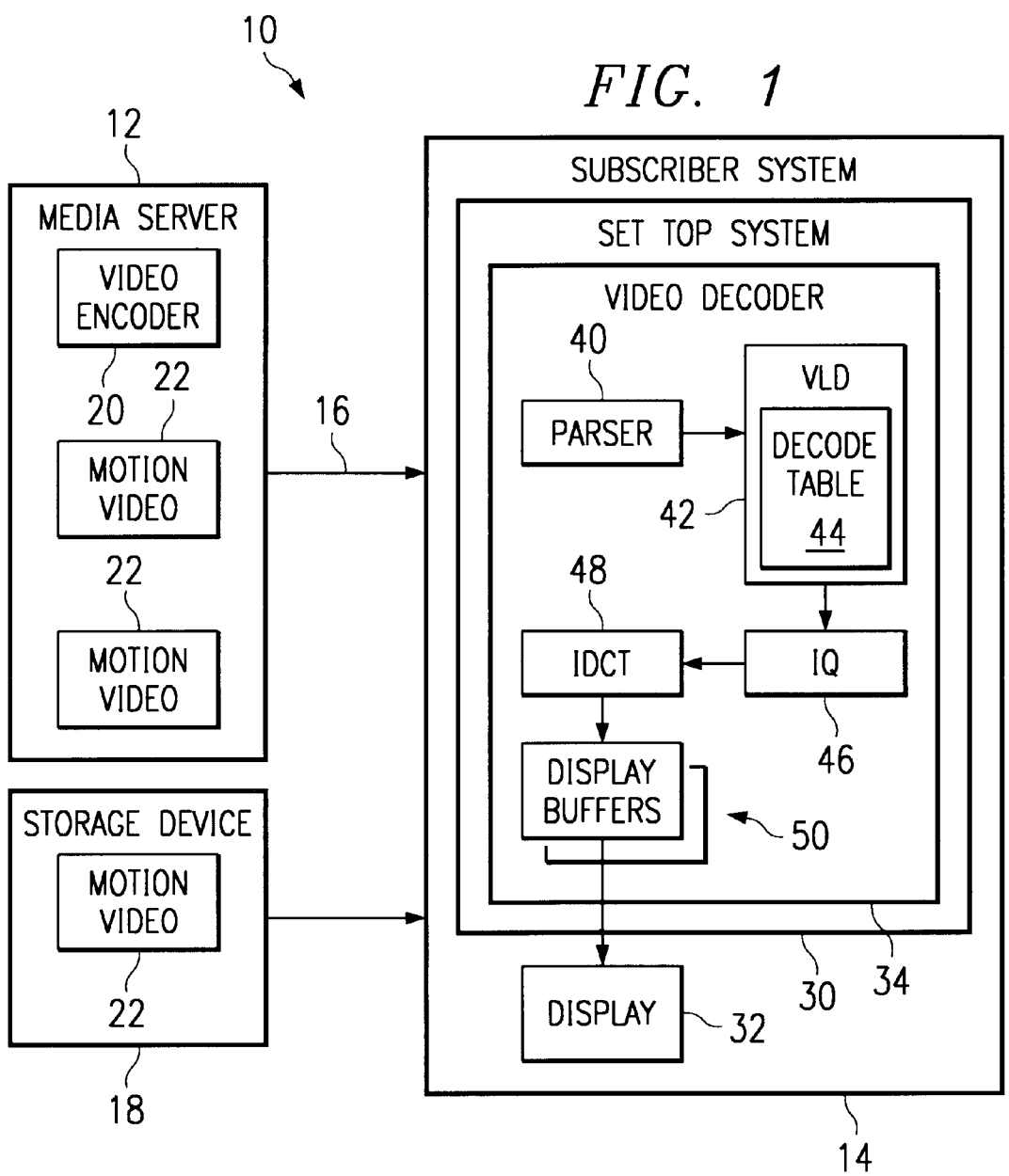
FIG. 1 is a block diagram illustrating an interactive television network system in which variable length codes are used to transmit and store video data in a comprised format and are decoded for display to a user in accordance with one embodiment of the present invention.

FIG. 1 illustrates an interactive television network system 10 for providing motion video in a compressed format in accordance with one embodiment of the present invention. In this embodiment, the interactive television network system 10 includes a media server 12 connected to a number of subscriber systems 14 by a network 16. Motion video is compressed into a stream of variable length codes in accordance with the Moving Picture Experts Group (MPEG) standard for transmission over the network 16 to the subscriber systems 14. At the subscriber systems 14, the variable length codes are decoded to regenerate the motion video for display to a user. It will be understood that the motion video or other suitable data may be otherwise suitably compressed into variable length codes using suitable compression standards and/or otherwise distributed to subscriber or other suitable network clients or non-network systems for decoding and displaying to a user. For example, motion video may be compressed in accordance with the JPEG standard in an Internet environment and/or may be stored in a compressed format on a transportable storage device 18, such as a video disk, for use in a non-networked video player.

The media server 12 may be a file server, minicomputer, mainframe, or any other suitable device capable of processing information based on programing instructions and communicating over a network with remote systems. The media server 12 includes a video encoder 20 and a number of motion video programs 22. The video encoder 20 encodes motion video into a stream of variable length codes in accordance with the MPEG or other suitable standard. The motion video programs 22 may be uncompressed programs that are compressed on the fly by the video encoder 20 during delivery to the subscriber system 14 or may have been previously compressed by the video encoder 20. In the later case, the motion video program 22 may be directly transmitted over the network 16 to the subscriber system 14.

Generally described, motion video programs 22 are encoded in accordance with the MPEG standard by digitizing the motion video into bit mapped images, performing a discrete cosine transform (DCT) of the bit map images, quantizing the resulting data to eliminate undetectable noise, and zig-zag patterning the data to generate run level pairs which are represented by variable length codes. Run level pairs denoting often used video data are represented by shorter codes while run level pairs denoting less frequently used types of video data are represented by longer codes. In this way, motion video is compressed for transmission or storage as a series of variable length codes which can be decoded to regenerate the motion video at the subscriber system 14 or other suitable video player.

The subscriber system 14 includes computer software and data that are loaded into system memory and executed by one or more processors. The computer software and data are generally identified by tables, engines, and the like. It will be understood that the computer software and data may be otherwise combined and/or divided for processing in or remotely from the subscriber system 14 or otherwise stored in system or other suitable memory in or remotely from the subscriber system 14 without departing from the scope of the present invention. Accordingly, the labels of the table, engine, and memory are for illustrative purposes and may be suitably varied.

The subscriber system 14 includes a set top system 30 and a display 32. The subscriber system 14 may also include an input device for communicating with the media server 12. The input device may be a keyboard, pointing device, or remote control. The subscriber may use the input device to request programming and other functions of the media server 12.

The set top system 30 includes a video decoder 34 for decoding variable length codes received in a compressed video stream. The compressed video stream may be received over the network 16 or from the transportable storage device 18. As described in more detail below, the variable length decoder 42 determines the length of the variable length codes based on information in the compressed video stream and is therefore able to process adjacent codes in parallel.

For the MPEG embodiment, the video decoder 34 includes a parser 40 for splitting audio and video data received in a common stream and a variable length decoder (VLD) 42 for decoding variable length codes in the compressed video stream. The variable length decoder 42 includes a decode table 44 which is used to match the identified codes to their run length pairs. The run length pairs are passed to an inverse quanitizer (IQ) 46, an inverse discrete cosine transform (IDCT) 48, and display buffers 50 to regenerate the motion video. The display buffer 50 builds video images and passes them to the display 32. The display 32 may be a television, computer monitor, or any other type of electronic, CRT, or other suitable device capable of displaying video images.

In this way, programming is transmitted in a compressed format to limit bandwidth necessary for transmission over the network 16. The network 16 may be a coaxial network or other suitable network capable of transmitting compressed data.

FIG. 2 illustrates details of the decode table 44 in accordance with one embodiment of the present invention. In this embodiment, the decode table 44 includes separately identifiable entries for each code length of a compression standard and accessed based on code length. The decode table 44 may be otherwise organized by code length by including a separate section or table for each code length of the compression standard. Using the code length and the value of at least part of the code from the compressed video stream, a code is decoded by matching it to a decode entry in the decode table 44. Accordingly, a match is determined from the decode table 44 using a single lookup process and the decode rate is constant.

Referring to FIG. 2, the decode table 44 includes a length field 60, a significant digit set field 62, a run field 64, a level field 66, and a sign field 68 for each decode entry 70. The length and significant digit set fields 60 and 62 are used to uniquely identify a code and match the code to a corresponding decode entry 70 in the decode table 44. The run, level, and sign fields 64, 66, and 68 yield the run level pair and its sign for the decode entry 70.

The significant digit set includes a set of digits in the compressed video stream that is able to distinguish between codes of a same length. In a particular embodiment, the significant digit set is standardized for all lengths and includes a minimum number of digits to distinguish between codes of each length for all the lengths of a compression standard. For the MPEG B-14 standard, in which codes have a length varying between two and fourteen digits, the significant digit set is five digits that immediately follow a leading position of a specified value in the compressed video stream that is used to determine the length of the codes. The decode table 44 includes thirty-two decode entries 70 for each code length. The thirty-two decode entries 70 include each possible permutation of the five digits in the significant digit set. Thus, for a given length, a match may be found for any significant digit set. A match yields the run level pair corresponding to the code, as well as the sign of the run level pair. If a run level pair is not defined for a length and significant digit set, a match yields an error.

Exemplary decode entries 70 for codes of the MPEP B-14 standard having a length of six digits are illustrated in the decode table 44 of FIG. 2. Referring to FIG. 2, a code having a determined length of six digits and a significant digit set beginning with the values "01" are decoded to a run level pair of 0,3 with the following third digit in the significant digit set indicating the sign of the pair. A "0" yields a positive sign while a "1" yields a negative sign. The remaining digits are immaterial to a six digit code and the different permutations of those remaining digits accordingly yield the same results. Similarly, a code having a length of six digits and a significant digit set beginning with the values "10" are decoded to a run level pair of 4,1 with the third digit in the significant digit set indicating the sign of the run level pair. A code having a length of six digits and a significant digit set beginning with the values "11", are decoded to a run level pair of 3,1, with the value of the third digit in the significant digit set indicating the sign for the run level pair. Codes of other lengths are similarly decoded.

Figure 3:
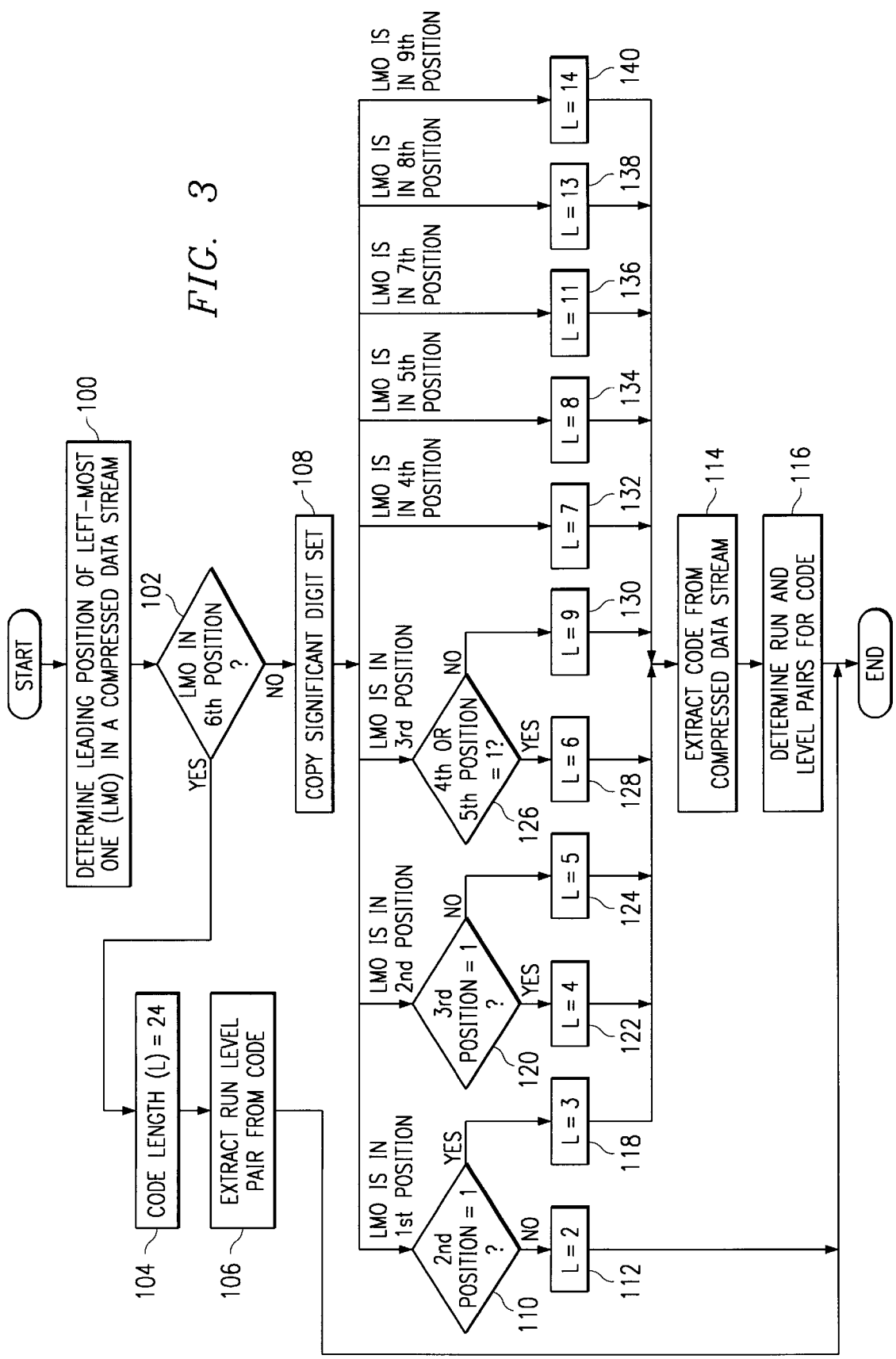
FIG. 3 is a flow diagram illustrating a computer method for variable length decoding in accordance with one embodiment of the present invention.

FIG. 3 illustrates a computer method for decoding variable length codes in accordance with one embodiment of the present invention. In this embodiment, the variable length codes are MPEG B-14 codes. It will be understood that the length of other types of variable length code may be similarly determined and the identified codes decoded using the described methodology.

Referring to FIG. 3, the method begins at set 100 in which a leading position of a specified value in a compressed data stream is determined. For the MPEG B-14 embodiment, the leading position of the specified value is the left-most one (LMO). Next, at decisional step 102, the variable length decoder 42 determines if the left-most one is the sixth digit in the compressed video stream. A left-most one in the sixth position indicates an escape code for the MPEG B-14 embodiment. Accordingly, if the left-most one is in the sixth position, the Yes branch of decisional step 102 leads to step 104 for escape code processing. At step 104, the length of the escape code is automatically determined to be 24 digits. Next, at step 106, the run. level pair for the escape code is extracted directly from the compressed video stream. The run level pair is the last 18 digits of the escape code. Step 106 leads to the end of the process at which point the leading code has been identified, extracted, and decoded.

Returning to decisional step 102, if the left-most one is not in the sixth position, then the variable length code is not an escape code and the Yes branch of the decisional step 102 leads to step 108. At step 108, the significant digit set is copied from the compressed video stream for later use to decode the leading code. For the exemplary MPEG embodiment, the significant digit set is the five digits immediately following the left-most one.

In the case where the left-most one is the first digit in the compressed video steam, step 108 leads to decisional step 110. The left-most one in the first position indicates that the variable length code has a length of either two or three digits. At decisional step 110, the variable length decoder 42 determines whether the code is two or three digits based on a value of a specified digit associated with the left-most one. In this case, the variable length decoder 42 determines the value of the first digit in the significant digit set, which is the second digit in the compressed video stream and immediately at the left-most one. A "0" in the first position of the significant digit set indicates that the variable length code has a length of two digits, and is the end of the block which means the variable length decoding is finished for this particular set of data. Accordingly, the No branch of decisional step 110 leads to step 112 where the length of the variable length code is determined to be two digits. Step 112 leads to the end of the process at which point the leading code has been identified, extracted, and decoded.

Returning to decisional step 110, a "1" in the first position of the significant digit set indicates that the variable length code has a length of three digits. Accordingly, the Yes branch of decisional step 110 leads to step 118 where the length of the variable length code is determined to be three digits. Step 118 leads to step 114.

At step 114, the variable length decoder 42 extracts the identified code from the compressed video stream. At step 116 the variable length decoder 42 decodes the code by matching the significant digit set copied at step 108 to a decode entry 70 in the decode table 44 for the determined code length. During the table lookup process, the variable length decoder 42 also determines the leading position of the left-most one in a remaining portion of the compressed video stream. Accordingly, adjacent codes are processed and parallel to speed up processing of the compressed video stream. Step 116 leads to the end of the process at which point the leading code has been identified, extracted, and decoded.

In the case where the left-most one is the second digit in the compressed video stream, step 108 leads to decisional step 120. The left-most one in the second position indicates that the variable length code has a length of either four or five digits. At decisional step 120, the variable length decode 42 determines whether the code is four or five digits based on the value of the first digit in the significant digit set, which is the third digit in the compressed video stream. A "1" in the first position of the significant digit set indicates that the variable length code has a length of four digits. Accordingly, the Yes branch of decisional step 120 leads to step 122 where the length of the variable length code is determined to be four digits. Step 122 leads to step 114 where, as previously described, the identified code is extracted from the compressed video stream for decoding based on the determined length.

Returning to decisional step 120, a "0" in the first position of the significant digit set indicates that the variable length code has a length of five digits. Accordingly, the No branch of decisional step 120 leads to step 124 where the length of the variable length code is determined to be five digits. Step 124 leads to step 114 where, as previously described, the identified code is extracted from the compressed video stream for decoding based on the determined length.

In the case where the left-most one is the third digit in the compressed video stream, step 108 leads to decisional step 126. The left-most one in the third position indicates that the variable length code has a length of either six or nine digits. At decisional step 126, the variable length decoder 42 determines whether the code is six or nine digits based on the value of the first and second digits in the significant digit set, which are the fourth or fifth digits in the compressed video stream. A "1" in either position indicates that the variable length code has a length of six digits. Accordingly, the Yes branch of decisional step 126 leads to step 128 where the length of the variable length code is determined to be six digits. Step 128 leads to step 114 where, as previously described, the identified code is extracted from the compressed video stream for decoding based on the determined length.

Returning to decisional step 126, the absence of a "1" in the first and second positions in the significant digit set indicates that the variable length code has a length of nine digits. Accordingly, the No branch of decisional step 126 leads to step 130 where the length of the variable length code is determined to be nine digits. Step 130 leads to step 114 where, as previously described, the identified code is extracted from the compressed video stream for decoding based on the determined length.

In the case where the left-most one is the fourth digit in the compressed video stream, step 108 leads to step 132. This position of the left-most one indicates that the variable length code has a length of seven digits. Accordingly, the variable length code is determined to have seven digits at step 132. Step 132 leads to step 114 where, as previously described, the identified code is extracted from the compressed video stream for decoding based on the determined length.

In the case where the left-most one is the fifth digit of the compressed video stream, step 108 leads to step 134. This positioning of the left-most one indicates a code length of eight digits. Accordingly, the variable length code is determined to have eight digits at step 134. Step 134 leads to step 114 where, as previously described, the identified code is extracted from the compressed video stream for decoding based on the determined code length.

In the case where the left-most one is the seventh digit in the compressed video stream, step 108 leads to step 136. This positioning of the left-most one indicates a code length of eleven digits. Accordingly, the variable length code is determined to have eleven digits at step 136. Step 136 leads to step 114 where, as previously described, the identified code is extracted from the compressed video stream for decoding based on the determined length of the code.

In the case where the left-most one is the eighth digit in the compressed video stream, step 108 leads to step 138. This positioning of the left-most one indicates a code length of thirteen digits. Accordingly, the variable length code is determined to have thirteen digits at step 138. Step 138 leads to step 114 where, as previously described, the identified code is extracted from the compressed video stream for decoding based on the determined code length.

In the case where the left-most one is the ninth digit in the compressed video stream, step 108 leads to step 140. This position of the left-most one indicates a code length of fourteen digits. Accordingly, the variable length code is determined to have fourteen digits at step 140. Step 140 leads to step 114 where, as previously described, the identified code is extracted from the compressed video stream for decoding based on the determined code length.

In a particular embodiment, length is calculated using the left-most one in the following way. A left-most one in the first position results in a value returned of "0". Similarly, a left-most one in the second position results in a value returned of "1". By adding three to the leftmost one value, a good initial estimate of the length of the code is obtained. For example, for a left-most one equal to "0", length is possibly three digits. Decisions are made at steps 110 and 120 to fix these left-most ones that have multiple lengths. However, for left-most ones in other positions, they are significantly different from three plus the left-most one value. A fix-up register is used to make the correction. The fix-up register contains the value "0XFFE150". This value contains eleven two-bit values that are used for each possible left-most one. The fix-up value represents a correction to the initial approximation. Written in binary form, "0XFFE150" equals 11,11,11,11,11,01,00,01,10,10,00, and 00, which corresponds to 333331012200 which are the values added to the approximate length for the left-most one equal to 11,10,9,8,7,6,5,4,3,2,1,0. The approximate fix-up value is then added to the approximation to obtain the proper length.

In this way, the length of the codes in the compressed video stream is determined based on information within the compressed video stream. Accordingly, table lookups, redundancy, and associated processing are minimized. In addition, because length is determined prior to decoding, processing may be initiated on a next code in the compressed video stream while the previous code is being decoded. This allows a variable length code to be decoded with every pass of the process, which is repeated for the entirety of the compressed video stream. Thus, performance is completely deterministic on a statically scheduled architecture.

Although the present invention has been described with several embodiments, various changes and modifications may be suggested to one skilled in the art. It is intended that the present invention encompass such changes and modifications as fall within the scope of the appended claims.

What is claimed is:

1. A method for identifying variable length codes in a compressed data stream, comprising:

determining a leading position of a specified value in the compressed data stream; and determining a length of a leading variable length code in the compressed data stream based on the leading position of the specified value independently of a lookup table.

2. The method of claim 1, wherein at least one of the leading positions of the specified value is associated with more than one possible length of the leading variable length code, the act of determining the length of the leading variable length code in the compressed data stream comprising:

determining a value of a specified digit in the compressed data stream based on the leading position of the specified value; and determining the length of the leading variable length code based on the value of the specified digit.

3. A method for decoding variable length codes in a compressed data stream, comprising:

determining a leading position of a specified value in the compressed data stream;

determining a length of a leading variable length code in the compressed data stream based on the leading position of the specified value; and decoding the leading variable length code based on the length of the leading variable length code independently of a lookup table.

4. A video decoder, comprising:

a decode table including decode entries organized by code length; and a variable length decoder operable to determine a leading position of a specified value in a compressed data stream, determine a length of a leading variable length code in the compressed data stream based on the leading position of the specified value independently of a lookup table, and to use the length of the leading variable length code to access the decode table and decode the leading variable length code.

5. The method of claim 3, wherein at least one of the leading positions of the specified value is associated with more than one possible length of the leading variable length code, the act of determining the length of the leading variable length code in the compressed data stream comprising:

determining a value of a specified digit in the compressed data stream based on the leading position of the specified value; and determining the length of the leading variable length code based on the value of the specified digit.

6. The video decoder of claim 4, wherein:

at least one of the leading positions of the specified value is associated with more than one possible length of the leading variable length code; and said variable length decoder is further operable to determine the length of the leading variable length code in the compressed data stream by determining a value of a specified digit in the compressed data stream based on the leading position of the specified value; and determining the length of the leading variable length code based on the value of the specified digit.

* * * * *